United States Patent [19]
Fischbeck et al.

[11] Patent Number: 5,746,127
[45] Date of Patent: May 5, 1998

[54] ELECTROFORMED SQUEEGEE BLADE FOR SURFACE MOUNT SCREEN PRINTING

[75] Inventors: Karl W. Fischbeck, Endicott; Gary T. Marks, Phelps, both of N.Y.

[73] Assignee: AMTX, Inc., Canandaigua, N.Y.

[21] Appl. No.: 646,380

[22] Filed: May 3, 1996

[51] Int. Cl.$^6$ .................................................. B05C 17/04
[52] U.S. Cl. ........................ 101/123; 101/124; 101/129
[58] Field of Search .................................... 101/114, 123, 101/124, 127, 128.4, 129, 155, 157, 167, 169

[56] References Cited

U.S. PATENT DOCUMENTS

| | | |
|---|---|---|
| 3,930,455 | 1/1976 | Bremer . |
| 5,044,306 | 9/1991 | Erdmann . |
| 5,078,082 | 1/1992 | van Dyk Soerewyn . |
| 5,254,362 | 10/1993 | Shaffer et al. . |
| 5,323,700 | 6/1994 | Katsuyama et al. . |
| 5,357,856 | 10/1994 | Hasegawa et al. . |
| 5,387,044 | 2/1995 | Accardo . |
| 5,478,699 | 12/1995 | Blessington et al. . |

FOREIGN PATENT DOCUMENTS 2-088787  3/1990  Japan .

OTHER PUBLICATIONS

Hall, "Developing a Low PPM Defect Level Ultra–Fine Pitch Process, New Technologies for Perfect Printing", *User's Guide to More Precise SMT Printing*, MPM Corporation, pp. 12–21, (1994).

Freeman, "New Technologies for Perrfect Printing", *User's Guide to More Precise SMT Printing*, MPM Corporation, pp. 22–29, (1994).

*Primary Examiner*—Ren Yan
*Attorney, Agent, or Firm*—Oliff & Berridge, PLC

[57] ABSTRACT

A novel electroformed squeegee blade for the uniform deposition of printing material such as solder paste and the like onto printed wiring boards is disclosed. A method of fabricating the electroformed squeegee blade is also disclosed. The method of fabrication, which produces an electroformed squeegee blade having smooth, planar, and flat surfaces, involves electroforming at least one uniform layer of metal onto a conductive substrate and removing the substrate. Also disclosed is an apparatus and method that employ the electroformed squeegee blade to uniformly deposit printing material on printed wiring boards.

13 Claims, 3 Drawing Sheets

ELECTROFORMED SQUEEGEE BLADE FOR SURFACE MOUNT SCREEN PRINTING

FIELD OF THE INVENTION

The present invention relates generally to the deposition of printing material on printed circuit/wiring boards and more particularly to a method of fabricating an electroformed squeegee blade used for the uniform deposition of printing material on printed wiring boards and/or printed circuit boards (PWBs or PCBS).

BACKGROUND

Screen printing apparatus, which have a wide variety of uses in the electronic substrate fabrication and electronic assembly industries, are well known as exemplified by U.S. Pat. Nos. 5,478,699; 3,930,455; 5,387,044; 5,357,856 and 5,323,700. These uses include, but are not limited to, the deposition of printing material, such as solder paste, conductive epoxies, thermal set plastics, conductive/resistive inks and the like, in the preparation of surface mount PCBs, Flip Chip Bumping, Co-Fired Via Fill, BGA, conductive/resistive circuit applications and the like.

The printing apparatus typically comprises a screen printer, a stencil, and a squeegee blade assembly. Various printing materials may be applied to a substrate by the application of printing material through stencil apertures on to the substrate. For example, in the preparation of printed wiring boards (PWBS) for the placement of surface mounted components, solder paste is deposited on the PWB through stencil apertures. The stencil apertures match the shape of PWB/PCB pads and are at the same locations as the PWB/PCB pad image array to be applied. The stencil images are aligned with the PWB/PCB images to be applied, placed in intimate contact with the PWB/PCB and held firmly together with the PWB/PCB until after the print stroke is completed. An amount of solder paste that forms the solder pads is applied to the top surface of the stencil. The squeegee blade is then used to draw the solder paste over the entire stencil image area, push the solder paste into the corresponding apertures of the stencil and form the solder deposition on the PWB pads. The component to be mounted is then placed directly into the wet solder paste.

As the electronics industry has progressed over the past few years, the trend has been towards the use of more complex devices and smaller circuits. A concern in the soldering of components is to consistently provide the precise volume of solder to the PWB/PCB pad sites to form effective solder joints. It is imperative that the amount/volume of solder paste applied to each PCB/PWB soldering pad is consistent and uniform so that the lowest possible defect levels in manufacturing is maintained. An inadequate amount of solder due to incomplete aperture filling during the squeegee printing stroke can lead to problems in forming consistent, uniform and reliable electromechanical solder joints. Excessive solder due to the overfilling of stencil apertures during the squeegee printing stroke can result in shorting or "bridging" between complex components, for example, QFPs, TSOPs, etc., pins or leads, resulting in problems in forming consistent, uniform and reliable solder joints. Both insufficient and excessive solder paste deposits lead to increased repair and rework requirements, high overall manufacturing costs, as well as finished product quality/reliability issues due to random variation from documented industry standard solder joint specifications.

Efforts have thus focused on the development of materials that are better suited for fine pitch screening processes. One example is the introduction of new types of apparatus to aid movement of the solder paste over the aperture. For example, U.S. Pat No. 5,254,362 to Shaffer et al. relates to a method and apparatus for depositing solder paste on a printed wiring board. The method involves the vibration of a squeegee blade assembly by a vibrator to produce a slight circular motion in addition to the planar motion of the squeegee blade. U.S. Pat. No. 5,044,306 to Erdmann relates to a method of using two squeegee blades for wiping solder paste onto a printed wiring board. The method involves using a first squeegee to wipe solder paste across a stencil in combination with a second squeegee that cooperates with a tray to deposit solder paste at the beginning of a wiping stroke. The tray also cooperates with the first squeegee to pick up excess solder paste at the end of a wiping stroke.

Another example of such efforts is the introduction of new types of squeegee blades. See, for example, U.S. Pat. No. 5,078,082 to van Dyk Soerewn and Hall, *Developing a Low PPM Defect Level Ultra-Fine Pitch Process, New Technologies for Perfect Printing*, User's Guide to More Precise SMT Printing, MPM Corporation, pp. 12–21 (1994).

In place of the traditional hard rubber blades, the squeegee blades available in the market place today are typically manufactured from high density polyurethane or stainless steel in a stamping, cutting or etching process. These squeegee blades are sometimes treated with alternate coatings and processes with the intention of improving the solder paste deposition process.

The use of stainless steel squeegee blades has enabled a more controlled and consistent print height across the entire board area. However, as disclosed in Freeman, *New Technologies for Perfect Printing*, User's Guide to More Precise SMT Printing, MPM Corporation, pp. 22–29 (1994), "any irregularities in the circuit board surface can cause damage to the fine webs in the fine pitch areas, since steel is not 'forgiving.' In addition, steel lacks lubricity, causing greater wear on the stencil." Thus, room for improvement remains.

Polyurethane squeegee blades are designed to be somewhat flexible, thereby readily deforming to the stencil surface. The inherent compliance of polyurethane squeegee blades is desirable in certain applications, for example, step or multi-level stencils. In the use of step or multi-level stencils, compliance with the stencil surface has proven advantageous. At the same time, however, deformation of the blade edge is disadvantageous due to aperture scooping occurring during the printing process. Scooping is the result of polyurethane blade material compliance or deformation extending beyond the top plane of the stencil into an aperture and removing (scooping) solder paste out of the aperture during the squeegee print stroke. Scooping is a major cause of insufficient solder joints and the associated problems that result from insufficient solder joints.

Reduced squeegee compliance, deformation and scooping are achieved by using a less flexible blade material. The more rigid, less compliant material of choice for squeegee blades has been stainless steel. Print quality is improved by using metal squeegee blades, thereby yielding a more controlled and consistent print height across the entire image area, a better definition of the solder paste deposition on the PCB/PWB pads, a minimized amount of "scooping" and an overall improved aperture filling. Many of the negative effects of polyurethane squeegee blades are thus overcome with metal blades.

Although metal squeegee blades offer improved printing results, they are not ideal in all aspects due to sticking or adhesion of printing material to the metal blade. Research to combat the inherent incompatibility of the metal squeegee blade with metal stencils as well as the tendency of printing materials and solder paste to stick to the metal squeegee blade has thus been conducted. For example, various alternative and specialty coatings as well as secondary plating process steps have been explored to minimize the adherence or sticking of solder paste to the squeegee blades. The adherence of print material or solder paste to the squeegee blade has a profound negative impact on the consistency and quality of the resultant deposition on the PWB/PCB. Printing material additives such as tackifiers, binders, carriers and fluxes added for improved downstream process performance, increase the adherence of print material to the squeegee blade. Secondary surface preparation steps such as plating and specialty coatings improve the release characteristics of metal squeegee blades to some degree. The drawback of current metal squeegee blades that are processed through a secondary step is that with repeated use, the specialty coating or plating is worn away exposing the underlying bare metal and causing the recurrence of solder paste sticking or adhesion problems. The exposed bare metal increases the occurrence of insufficient or excessive solder paste, which in turn, affects the performance of the metal squeegee blade, thereby degrading the consistency, reliability and overall quality of the printing process.

Additional conventional methods of fabricating squeegee blades include casting from a mold and machining. These methods may require a finishing step to produce the final product. In addition, chemical etching, a subtractive fabrication process, wherein characteristic surface features are formed when a polished metal surface is etched by suitable reagents, has been used. Chemical etching as a manufacturing process has characteristics that limit its use in high tolerance, high precision applications.

Another conventional technique is electropolishing. This technique starts with a chemically etched squeegee blade as described earlier, and adds an electrochemical etching process that, in theory, smooths the surface of the squeegee blade. The electropolished surface does help solder paste release to a certain degree when compared to a non-electropolished surface. However, a typical electropolished squeegee blade still has most of the drawbacks associated with a chemically etched squeegee blade. Thus, although electropolishing minimizes the imperfections introduced by chemical etching, it is unable to completely compensate for them and the drawbacks associated with chemical etching are carried forward to the finished product even after electropolishing.

Difficulties observed during the use of conventional squeegee blades include negative wear characteristics, incompatibility with stencil materials, incompatibility with printing materials and ineffectiveness of material transfer.

Negative wear characteristics and incompatibility with stencil materials associated with the use of conventional metal squeegee blades include, but are not limited to, the deformation of the stencil foil material due to the unforgiving nature of steel. Also, "coining" or streaking of the base stencil foil material is more prevalent with conventional metal squeegee blades due to the friction that occurs between the metal squeegee blade and the stencil. Stencil fatigue occurs at an earlier point in life cycle testing and is most easily noticed as printing material deposition definition becomes less well-defined. Increased stencil wear, shorter stencil life, damage to fine aperture areas, and coining and streaking of the stencil are the result of a lower lubricity and an incompatibility between stencil materials and conventional metal squeegee blades.

Incompatibility with printing materials and ineffective material transfer of conventional squeegee blades is most evident in the observed high volume of printing material sticking to the squeegee blade, incomplete aperture filling, redistribution of printing material away from the stencil image area, inconsistent printing deposition volumes and piling of solder paste along the sides of the squeegee print stroke. Ineffective material transfer is best illustrated by the pulling of printing material or solder paste out of stencil apertures by the trailing edge of the squeegee blade during the print stroke. As the squeegee blade passes over an aperture, solder paste adhering or sticking to the blade causes the solder paste to be pulled out of the previously filled aperture, thereby showing signs of lifting or "tailing" of printing material out of the aperture on the trailing edge of the print stroke. Incompatibility between metal squeegee blade and printing material, lower solder paste shearing forces, lower lubricity and a tendency toward solder paste sticking introduce significant inconsistency into the printing process.

Control of the solder paste can become a problem depending on the ratio of the aperture width and thickness of the stencil. This is because up to 70% of the printing material or solder paste adheres to the squeegee blade rather than depositing on the board. Another problem is stencil offset, which is caused by friction between the squeegee blade and the stencil. During the printing cycle, the stencil can be offset in the direction of the squeegee blade print stroke, thus offsetting the stencil aperture image relative to the PCB/PWB pads with which they are intended to register.

FIG. 1 depicts a prior art application of solder paste 1 by a solder paste application machine 2. The solder paste application machine 2 can be a Model SP 200 screen printer by MPM Corporation (Franklin, Mass.) or an equivalent. FIG. 1 depicts the machine 2, which is connected to and controls squeegee blade assembly 3 including squeegee blade holder 4 and squeegee blade 5 made of stainless steel, plated stainless steel, propriety specialty coated stainless steel or polyurethane. Squeegee blade assembly 3 may be either a floating or non-floating head assembly. The squeegee blade 5 is shown in position, after having been drawn across the stencil 6. An amount of solder paste 1 is shown still adjacent to the squeegee blade 5. This solder paste 1 is in excess of the amount deposited and has been drawn across the stencil 6 in the direction indicated by the arrow $A_1$.

The stencil aperture 7 is filled with solder paste 1. At the leading edge 7a (i.e., the first edge of an aperture to be contacted by the squeegee blade 5) of the stencil aperture 7, the amount of solder paste 1 is much less than the amount of solder paste 1 at the trailing edge 7b (i.e., the last edge of an aperture to be contacted by the squeegee blade 5) of the stencil aperture 7. As a result, surface mounted components (not shown), which are mounted to a printed wiring board (not shown) upon which solder paste 1 has been deposited may move, losing effective electrical contact with the desired circuit(s) or even becoming disconnected from solder paste 1 due to uneven application of solder paste 1. Therefore, such application of solder paste 1 is inappropriate to securely and effectively fasten surface mounted components to printed wiring boards.

Ideally, printing material or solder paste should be deposited evenly across the entire stencil image area. If the solder paste deposition is not uniform, components mounted in such an arrangement may shift, move or become dislodged with subsequent PWB processing.

It is thus highly desirable to select or specify an improved means for consistently applying printing material evenly to a PWB through the apertures of a stencil.

All references cited herein are incorporated herein by reference in their entireties.

SUMMARY OF THE INVENTION

Embodiments of the invention are directed to a novel electroformed squeegee blade suitable for the deposition of printing material such as solder paste and the like on a printed wiring board.

Other embodiments of the invention are directed to a method of fabricating an electroformed squeegee blade suitable for screen printing and other applications in which a smooth squeegee blade is suitable. The method for preparing the electroformed squeegee blade according to the invention involves electroforming at least one uniform layer of metal. The invention also encompasses electroformed squeegee blades prepared utilizing multiple layer fabrication techniques, which have additional benefits and advantages. For example, a variety of blade edge designs and various blade edge thicknesses that allow for user definable printing characteristics could be prepared. Thus, electroformed squeegee blades permit the manufacture and use of multiple layer designs and a wide variety of blade edges that are custom fit to the printing application and printing materials being used.

The method according to the invention eliminates any requirement for secondary processing, additional finishing, specialty coating or plating steps. The method thus produces smooth, planar, and flat surfaces without additional lapping, grinding, forming, or machining to obtain flatness or planarity.

The electroformed squeegee blade of the invention is more compatible with stencil materials due to increased lubricity and decreased friction between the electroformed squeegee blade and the stencil.

Further embodiments of the invention include a method and apparatus for uniformly depositing solder paste on a printed wiring board using the electroformed squeegee blade.

Other features and advantages of the invention will become more fully apparent from the following detailed description of preferred embodiments, the appended claims, and the accompanying drawings.

BRIEF DESCRIPTION OF THE DRAWINGS

The invention will be described in conjunction with the following drawings in which like reference numerals designate like elements and wherein.

DETAILED DESCRIPTION OF PREFERRED EMBODIMENTS

Figure 1:
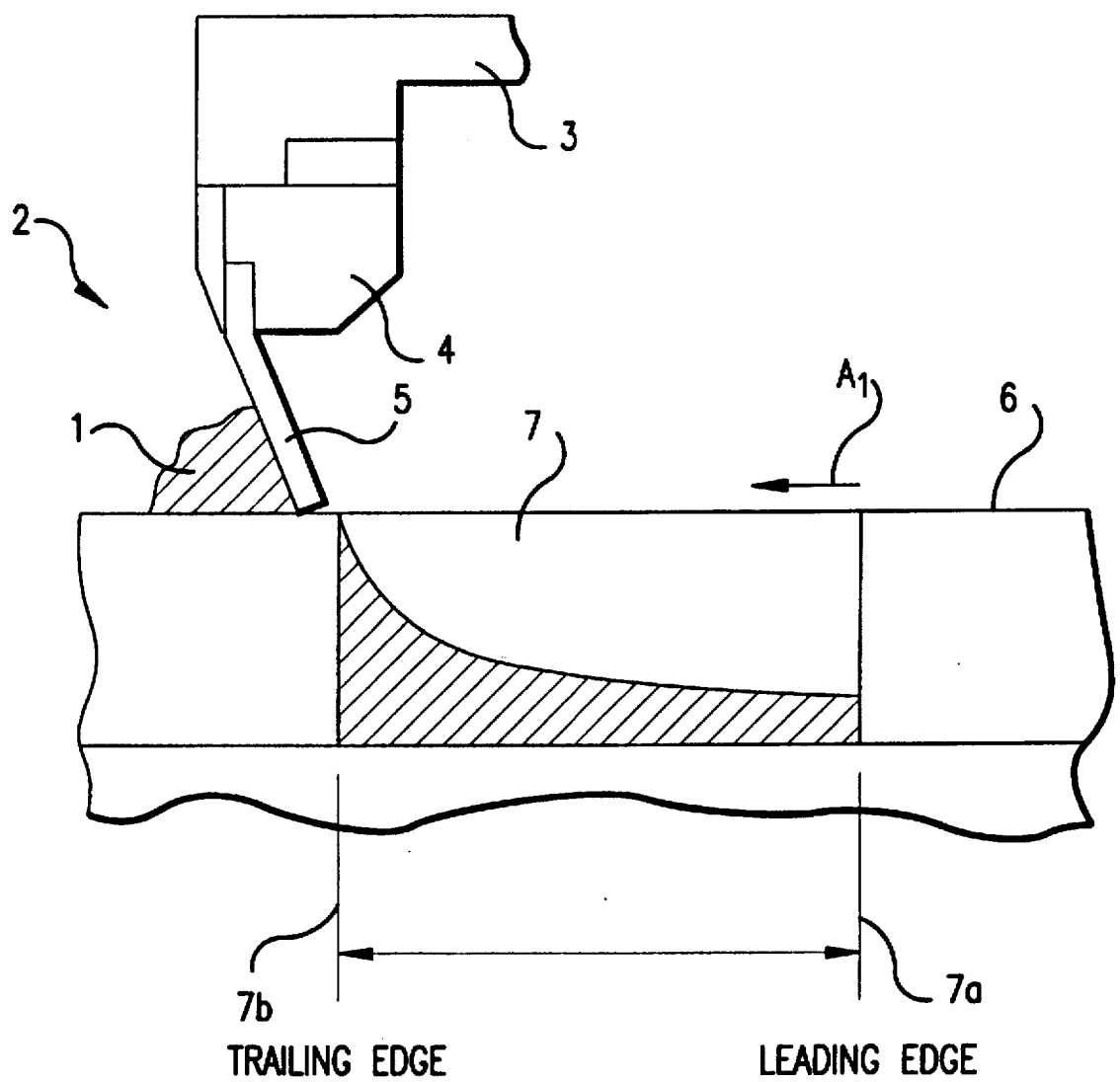
FIG. 1 is a side view depicting the application of solder paste to an aperture of a stencil in accordance with the prior art.

Electroformed squeegee blades are used in the printing operation of the electronics packaging industry, and more particularly in surface mount manufacturing. Unlike conventional methods of producing squeegee blades, squeegee blades according to the invention are grown atom by atom with an electroforming process that utilizes specialized chemistries and process conditions that render the squeegee blade with improved properties and characteristics related to the squeegee blade application.

Print tests using the electroformed squeegee blade according to the invention show a minimum 75% reduction in the amount of residual print material left on the stencil after each print cycle. The result is a reduction in the build-up of dried material clogging stencil apertures and improved print definition. The enhanced printing consistency that results from the use of an electroformed squeegee blade according to the invention reduces the occurrence of bridging, bleed-out and insufficient aperture filling, key causes of manufacturing defects. By reducing the number of defects associated with stencil printing, a reduction in manufacturing costs is achieved.

Due to the enhanced material compatibility between the stencil and the electroformed squeegee blade, stencil wear normally associated with the printing operation is reduced. Printing tests performed with current technology metal squeegee blades show stencil coining and wear by visual inspection, while electroformed squeegee blades exhibit little or no wear at all after an equal number of printing cycles on a test stencil.

A major cause of the coining and wear seen for the current technology metal squeegee blades introduced during the manufacturing process is a lack of blade edge planarity. The electroformed squeegee blade according to the invention provides enhanced squeegee blade edge planarity that has been unachievable under current chemical etching, laser cutting, molding or secondary processing steps. As a result of the reduced wear, the life expectancy of the stencil is anticipated to increase by 200%. By increasing the number of print cycles due to decreased stencil wear, manufacturing quality remains consistent for an extended period of time, thus improving overall manufacturing yields. In comparative testing, after an equal number of print cycles with an electroformed versus a conventional metal squeegee blade, significant wear and coining can be observed with the conventional squeegee blade, while no wear can be detected with the electroformed squeegee blade.

Another benefit of the electroformed squeegee blade according to the invention is that as the surface tension attributed to the squeegee blade is reduced, the tendency of the printing material to stick to the squeegee blade is minimized. This is a problem most noticeable during the use of two squeegee blades as the direction of squeegee blade travel is changed and a switch from front to rear or rear to front squeegee blades is made. The result is often a smearing of the printing material, presenting an opportunity for the introduction of printing defects. With an electroformed squeegee blade, the printing material has a tendency to roll into a uniform cylindrical mass ahead of the squeegee blade during printing. Because of the lowered surface tension associated with the electroformed squeegee blade, the cylindrical mass of printing material is left on the stencil, precisely aligned for the next print stroke. As a result, 30% less printing material is required to be applied to the stencil and waste is reduced. This more efficient use of printing material or solder paste reduces waste and improves the overall print deposition quality, uniformity and consistency.

During printing trials, an electroformed squeegee blade in accordance with the invention required a reduced amount of solder paste printing material relative to that of conventional squeegee blades. This is due to a minimization of sticking of the printing material to the squeegee blade, an elimination of accumulating or piling of printing material along the side of the stencil image outside of the squeegee's reach, and an overall cleaner stencil surface. In addition, improvement is achieved due to a consistent volume of paste being available across the whole stencil image area, which further enhances printing performance.

The advantages of the invention extend beyond the actual printing process. After printing is completed and the clean-up process begins, a significant savings is realized in time, materials, and toxic material disposal costs. After each test printing run with an electroformed squeegee blade, clean-up has been reduced to less than 5 minutes, while printing with competitive squeegee blades including stainless steel, plated stainless steel, propriety specialty coated steel, and 80, 85 and 90 durometer polyurethane squeegee blades, requires anywhere from 15 to 30 minutes for clean-up. The number of clean-up wipes required after use of an electroformed squeegee blade is reduced to one from the fifteen to twenty required for competitive products. More efficient use of printing materials, reduced waste, and overall reduction in clean-up requirements, results in a dramatic reduction in toxic waste disposal costs.

The method of the invention, which is a variation of the method disclosed in U.S. Pat. No. 5,478,699 to Blessington deceased, et al., involves electrodepositing metal on a conductive substrate.

Typical substrate materials include stainless steel, iron plated with chromium or nickel, nickel, copper, titanium, aluminum, aluminum plated with chromium or nickel, titanium palladium alloys, nickel-copper alloys such as Inconels® 600 and Invar® (available from Inco, Saddle Brook, N.J., and the like. Non-metallic substrates can also be used if they have been made conductive, for example, by being appropriately metallized using metallization techniques known to the art, such as electroless metallization, vapor deposition, and the like. A conductive substrate is first cleaned by methods well known to those of skill in the art. The sequence of cleaning steps can include washing with isopropyl alcohol, vapor degreasing in trichloroethylene, electrocleaning, rinsing in distilled water, washing in nitric acid, and final rinsing in distilled water.

The process takes place within an electroforming zone comprising an anode, a cathode, and an electroforming bath. The bath may be composed of: ions or salts of ions of the layer-forming material, the concentration of which can range from trace to saturation, which ions can be in the form of anions or cations; a solvent; a buffering agent, the concentration of which can range from zero to saturation; an anode corrosion agent, the concentration of which can range from zero to saturation; and, optionally, grain refiners, levelers, catalysts, surfactants, and other additives known in the art. The preferred concentration ranges may readily be established by those of skill in the art without undue experimentation.

A preferred electroforming bath to plate nickel on a substrate comprises about 70–90 mg/ml of nickel ion in solution, about 20–40 mg/ml of $H_3BO_3$, about 3.0 mg/ml of $NiCl_2.6H_2O$ and about 4.0–6.0 ml/liter of sodium lauryl sulfate. Other suitable electroforming bath compositions include, but are not limited to, Watts nickel: about 68–88 mg/ml of nickel ion, about 50–70 mg/ml of $NiCl_2.6H_2O$ and about 20–40 mg/ml of $H_3BO_3$; chloride sulfate: about 70–100 mg/ml of nickel ion, about 145–170 mg/ml of $NiCl_2.6H_2O$ and about 30–45 mg/ml $H_3BO_3$; and concentrated sulfamate: about 100–120 mg/ml of nickel ion, about 3–10 mg/ml of $NiCl_2.6H_2O$ and about 30–45 mg/ml of $H_3BO_3$. Electroless baths such as electroless nickel baths can also be employed. Various types are available depending upon the properties required in the electroform deposition. These electroless baths are well known to those skilled in the art.

Examples of metals that can be electroformed onto the surface of a substrate include, but are not limited to, nickel, copper, gold, silver, palladium, tin, lead, chromium, zinc, cobalt, iron, and alloys thereof. Preferred metals are nickel and copper. Any suitable conductor or material that can be electrochemically deposited can be used, such as conductive polymers, plastics, and electroless nickel deposits. Examples of suitable auto-catalytic electroless nickel deposits include, but are not limited to, nickel-phosphorus, nickel-boron, poly-alloys, such as copper-nickel phosphorus, nickel-polytetrafluoroethylene, composite coatings, and the like. Methods of preparing electroless nickel deposits employed within the scope of this invention are well known to those skilled in the art of electroforming.

The electrolytic bath is energized using a suitable electrical source. Layer-forming ions from the solution are electroformed onto the conductive surface of the substrate. The process is allowed to proceed until a single layer has deposited on the substrate preferably ranging in thickness from about 0.200 to about 0.385 mm. After the single layer of metal is electroformed onto the surface of the substrate, the substrate is removed from the solution.

In addition, a squeegee blade having desired features can be prepared using a pattern of resist having a design complementary to the desired features in accordance with the process disclosed in U.S. Pat. No. 5,478,699.

The electroformed squeegee blade according to the present invention can be removed from the substrate by standard methods that include, but are not limited to, mechanical separation, thermal shock, dissolution and the like. These methods are well known to those of skill in the art.

Figure 2:
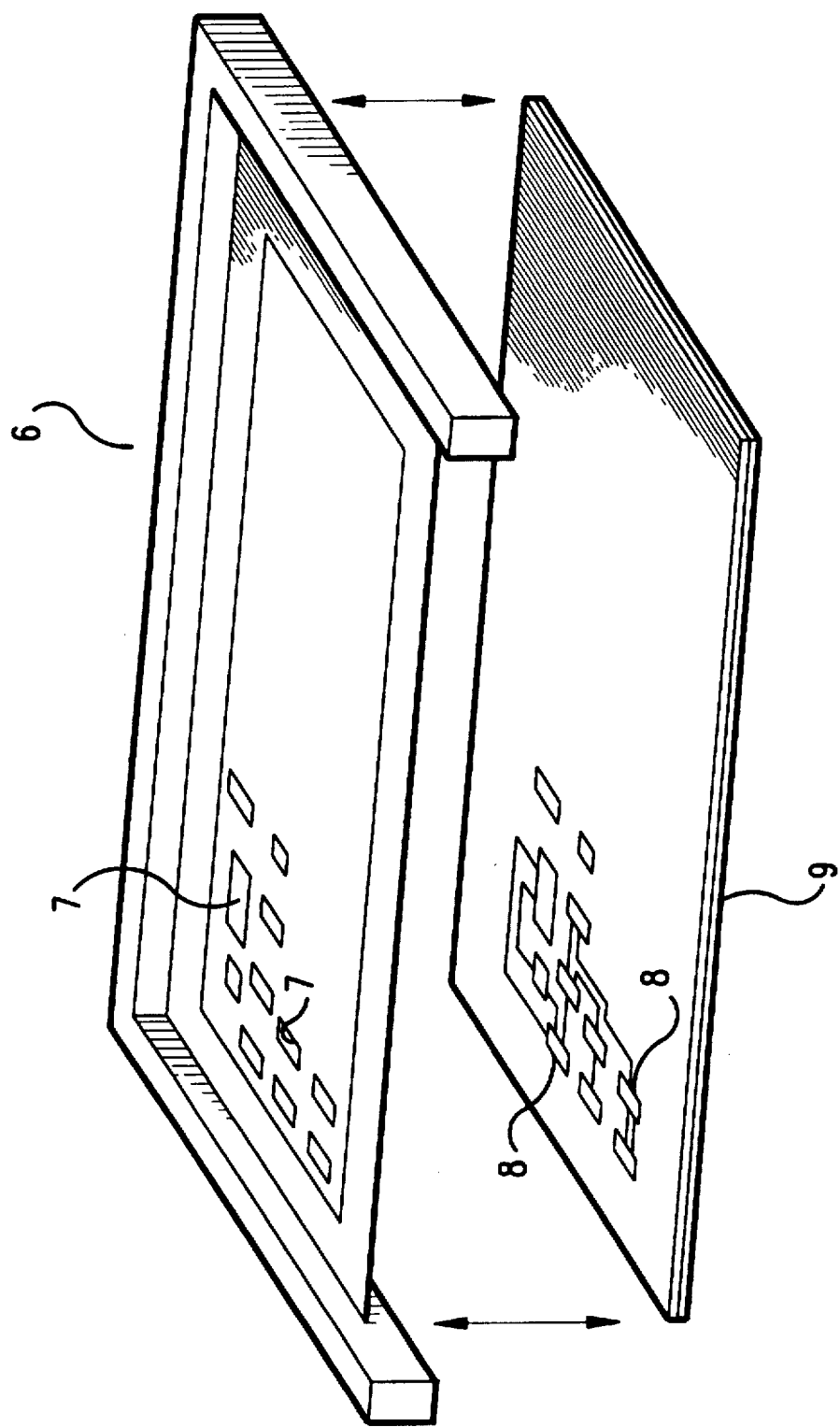
FIG. 2 is an exploded perspective view of a printed wiring board and a stencil employed in the application of solder paste onto the board in accordance with an embodiment of the invention.
Figure 3:
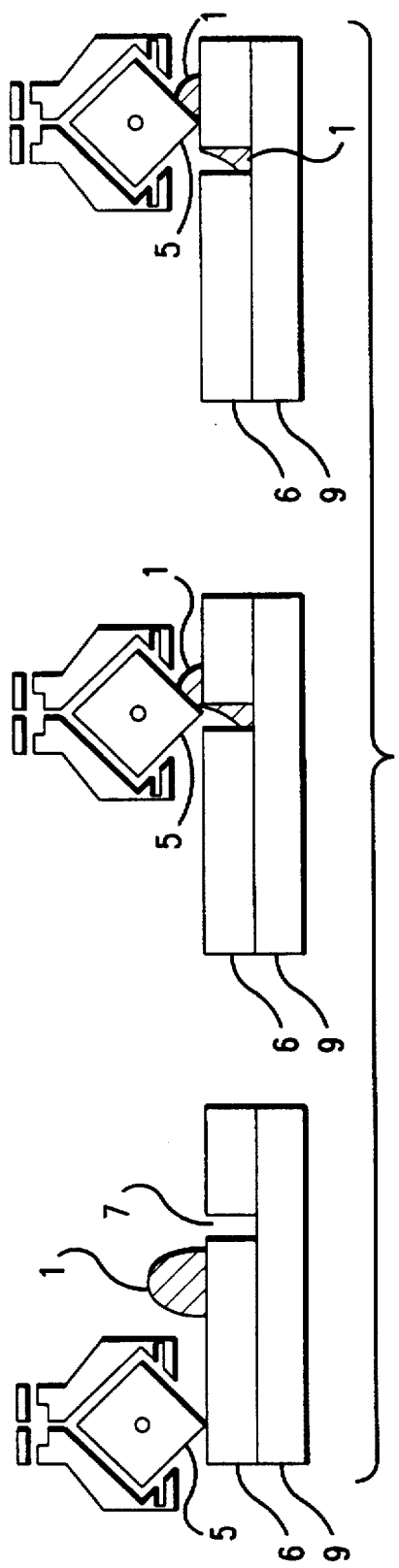
FIGS. 3 and 4 are sequential, schematic views showing the mechanism during the printing stroke and the solder collected at the end of the wiping stroke of a squeegee blade in the art (FIG. 3) and a squeegee blade according to an embodiment of the invention (FIG. 4).
Figure 4:
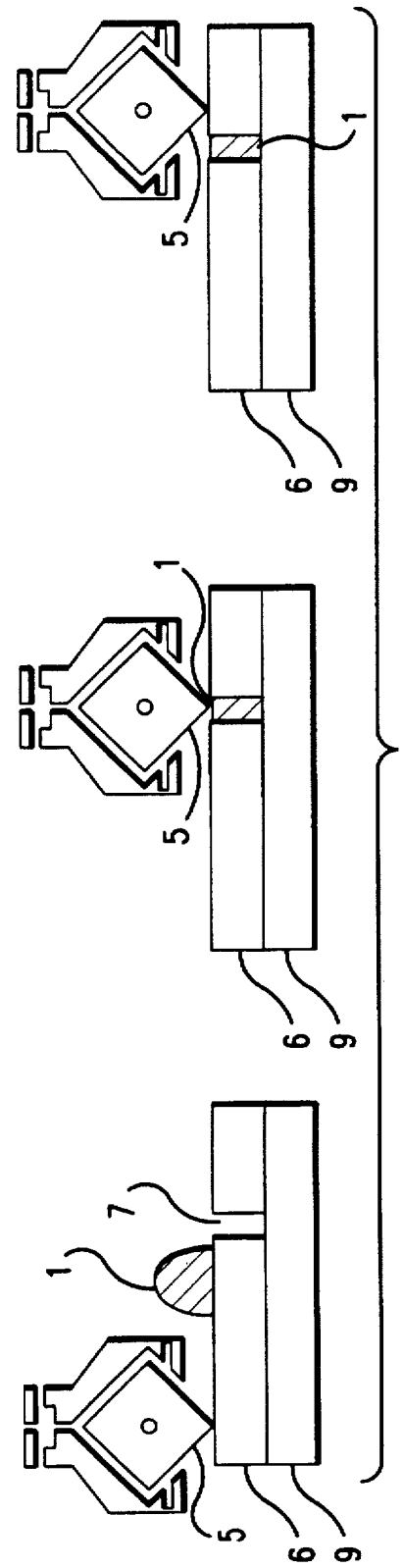

Referring to FIGS. 2 and 3, the electroformed squeegee blade 5 of the invention causes the solder paste 1 to be applied to a uniform vertical height in the stencil apertures 7 regardless of their orientation. As a result of the uniform deposition of the solder paste into each of the apertures 7, the solder pads 8 are uniformly deposited on the printed wiring board 9 of FIG. 2. The printed wiring board 9 is firmly held in place beneath the stencil 6 by, e.g., suction, tooling holes, adjustable mechanical fixturing or dedicated mechanical fixturing and after the deposition of the solder paste 1 is then released to the next operation in the printed wiring board manufacturing process.

As a result, the printed wiring board 9 with solder pads 8 produced according to the invention will more firmly hold surface mounted integrated circuits and/or components to the printed wiring board 9 for subsequent mounting and soldering flow operations.

Referring to FIGS. 3 and 4, 80, 85 and 90 durometer polyurethane squeegee blades have been used as comparison materials against the electroformed squeegee blade of the invention. As can be seen, the electroformed squeegee blade of the invention, which has an $HK_{500}$ hardness preferably about 200 to 600, and more preferably of about 390 to 450, permits a more uniform deposition of solder paste on the printed wiring board. As a result, the number of printed wiring boards that must be reworked for solder pad faults and integrated circuit mountings is minimal.

While this invention has been described in conjunction with specific embodiments thereof, it is evident that many alternatives, modifications and variations will be apparent to those skilled in the art. Accordingly, the preferred embodiments of the invention as set forth herein are intended to be illustrative, not limiting. Various changes may be made without departing from the spirit and scope of the invention as defined above.

What is claimed is:

1. An apparatus for depositing a printing material on a substrate, said apparatus comprising:

a stencil having a plurality of apertures therethrough, wherein said stencil is capable of being placed in contact with said substrate;

a depositing member for depositing said printing material onto said stencil; and an electroformed squeegee blade for spreading said printing material across said stencil, wherein said electroformed squeegee blade is capable of depositing said printing material on said substrate and said electroformed squeegee blade consists of electroformed material.

2. An electroformed squeegee blade consisting of electroformed material.

3. The electroformed squeegee blade of claim 2, wherein said electroformed material comprises an electroformed layer of material selected from the group consisting of nickel, copper, gold, silver, palladium, tin, lead, chromium, zinc, cobalt, iron, and alloys thereof.

4. The electroformed squeegee blade of claim 3, wherein said electroformed squeegee blade comprises an electroformed layer of material selected from the group consisting of nickel and copper.

5. The electroformed squeegee blade of claim 2, wherein said electroformed squeegee blade comprises an electroformed layer of at least one material selected from the group consisting of nickel-phosphorus, nickel-boron, copper-nickel phosphorus, nickel-polytetrafluoroethylene, and composites thereof.

6. A process for providing the electroformed squeegee blade of claim 2, said process comprising providing a conductive substrate core patterned with photoresist in a form of the squeegee blade and electroforming a layer of material onto said conductive substrate core to provide the electroformed squeegee blade.

7. The process of claim 6, wherein said conductive substrate core is selected from the group consisting of stainless steel, iron plated with chromium, iron plated with nickel, nickel, copper, titanium, aluminum, aluminum plated with chromium, aluminum plated with nickel, titanium palladium alloys and nickel-copper alloys.

8. The process of claim 6, wherein said electroforming material is selected from the group consisting of nickel, copper, gold, silver, palladium, tin, lead, chromium, zinc, cobalt, iron, and alloys thereof.

9. The process of claim 8, wherein said electroforming material is selected from the group consisting of nickel and copper.

10. The process of claim 6, wherein said electroforming material is at least one material selected from the group consisting of nickel-phosphorus, nickel-polytetrafluoroethylene, and composites thereof.

11. A method for depositing a printing material on a substrate, said method comprising:

placing a stencil having a plurality of apertures therethrough in contact with said substrate;

depositing said printing material onto said stencil; and moving the electroformed squeegee blade of claim 2 across said stencil to spread said printing material across said stencil and deposit said printing material on said substrate.

12. The method of claim 11, wherein solder paste is provided as the printing material and a printed wiring board is provided as the substrate.

13. A process of providing the electroformed squeegee blade of claim 1, said process comprising:

electroforming material on a substrate to form an electroformed squeegee blade on said substrate; and removing said substrate from said electroformed squeegee blade.

* * * * *